United States Patent
Carlson

(10) Patent No.: US 8,227,846 B2
(45) Date of Patent: Jul. 24, 2012

(54) SYSTEMS AND METHODS FOR A CONTINUOUS-WELL DECOUPLING CAPACITOR

(75) Inventor: Andrew E. Carlson, Franklin, MA (US)

(73) Assignee: Advanced Micro Devices, Inc., Austin, TX (US)

( * ) Notice: Subject to any disclaimer, the term of this patent is extended or adjusted under 35 U.S.C. 154(b) by 351 days.

(21) Appl. No.: 12/705,185

(22) Filed: Feb. 12, 2010

(65) Prior Publication Data

US 2011/0198677 A1    Aug. 18, 2011

(51) Int. Cl.
*H01L 29/76* (2006.01)
*H01L 29/788* (2006.01)

(52) U.S. Cl. ........ 257/296; 257/297; 257/300; 257/307; 257/313; 257/369; 257/E21.008; 257/E21.396; 257/E27.016; 257/E29.343; 257/E29.345; 438/251; 438/252; 438/394; 438/395; 700/121

(58) Field of Classification Search ................. 257/296, 257/297, 300, 307, 313, 369, E21.008, E21.396, 257/E27.016, E29.343, E29.345; 438/251, 438/252, 394, 395; 700/121
See application file for complete search history.

(56) References Cited

U.S. PATENT DOCUMENTS

| | | | | |
|---|---|---|---|---|
| 5,973,381 | A | * | 10/1999 | Kudo et al. ............... 257/532 |
| 2002/0117705 | A1 | * | 8/2002 | Lee et al. ................ 257/296 |
| 2002/0117720 | A1 | | 8/2002 | Lee et al. |
| 2005/0035410 | A1 | | 2/2005 | Yeo et al. |
| 2005/0236690 | A1 | | 10/2005 | Chung |
| 2007/0045710 | A1 | * | 3/2007 | Riekels et al. ........... 257/315 |
| 2007/0252217 | A1 | | 11/2007 | Oki |

FOREIGN PATENT DOCUMENTS

EP    1760786 A2    3/2007

OTHER PUBLICATIONS

PCT Notification of the International Search Report and the Written Opinion mailed Jun. 1, 2011 in PCT/US2011/024522.

* cited by examiner

*Primary Examiner* — Dao H Nguyen
(74) *Attorney, Agent, or Firm* — Ingrassia Fisher & Lorenz, P.C.

(57) ABSTRACT

A decoupling capacitor includes a pair of MOS capacitors formed in wells of opposite plurality. Each MOS capacitor has a set of well-ties and a high-dose implant, allowing high frequency performance under accumulation or depletion biasing. The top conductor of each MOS capacitor is electrically coupled to the well-ties of the other MOS capacitor and biased consistently with logic transistor wells. The well-ties and/or the high-dose implants of the MOS capacitors exhibit asymmetry with respect to their dopant polarities.

17 Claims, 6 Drawing Sheets

SYSTEMS AND METHODS FOR A CONTINUOUS-WELL DECOUPLING CAPACITOR

TECHNICAL FIELD

Embodiments of the subject matter described herein generally relate to semiconductor components, and more particularly relate to decoupling capacitors used in connection with such components.

BACKGROUND

It is often desirable to incorporate decoupling capacitors (or "decaps") in semiconductor components to electrically decouple one region of logic transistors from another such region. In most traditional decap designs, the ground node is connected to a lightly- or moderately-doped N-well and biased in accumulation. In this way, the low N-well resistance improves high-frequency response of the component while providing the desired decoupling characteristics.

Known decap designs are unsatisfactory in a number of respects, however. For example, logic circuits often require N-wells to be electrically coupled to the supply voltage. A space is therefore required between the logic N-well and the decap N-well to prevent leakage current between the wells or, in some extreme cases, latch-up. Furthermore, logic transistors close to the edge of the N-well are affected by what is termed the "well proximity effect" (WPE), which gives rise to an undesirable source of variation with respect to other transistors in the circuit.

Furthermore, because it is desirable to place the decap structure close to the surrounding logic, it is common to incorporate the decap within the standard cell rows. This, however, can result in an alteration of the N-well shape and an interruption of the regular pattern of the array.

Accordingly, it is desirable to provide improved decap designs that can be incorporated into standard cell rows while reducing variations in the well proximity effect experienced by surrounding logic devices.

BRIEF SUMMARY OF EMBODIMENTS

In general, a decoupling capacitor in accordance with various embodiments includes a pair of metal-oxide-semiconductor (MOS) capacitors formed in wells of opposite plurality, wherein each MOS capacitor has a set of well-ties and a high-dose implant. In some embodiments, a second conductive material (e.g., polycrystalline silicon or silicide) may be used in addition to or in place of metal in one or both of the MOS capacitors. A second insulating material (e.g. silicon nitride) may be used in addition to or in place of oxide in one or both of the MOS capacitors. In one embodiment, a high permittivity oxide is used as part of the insulating material of the MOS capacitor. The top conductor of each MOS capacitor is electrically coupled to the well-ties of the other MOS capacitor, and the well-ties and/or the high-dose implants of the MOS capacitors exhibit asymmetry with respect to their dopant polarities.

A method of forming a decoupling capacitor in accordance with one embodiment includes: providing a substrate having a first dopant polarity and defining a first well region; forming a second well region adjacent the first well region within the substrate, the second well region having a second dopant polarity opposite the first dopant polarity; forming a first high-dose implant within the first well region; forming a second high-dose implant within the second well region; forming a first set of well-ties in the first well; forming a second set of well-ties in the second well; forming one or more oxide layers over each or both of the first high-dose implant and the second high-dose implant; forming a first conductor over the first well region and a second conductor over the second well region; interconnecting the first set of well-ties and the second conductor to define a first electrical node; and interconnecting the second set of well-ties and the first conductor to define a second electrical node; wherein at least one of the first high-dose implant, the second high-dose implant, the first set of well-ties, and the second set of well-ties are formed such that they are asymmetrical with respect to dopant polarity.

This summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description. For the sake of brevity, conventional techniques related to semiconductor processing, and in particular CMOS processing, need not be described in detail herein.

Figure 1:
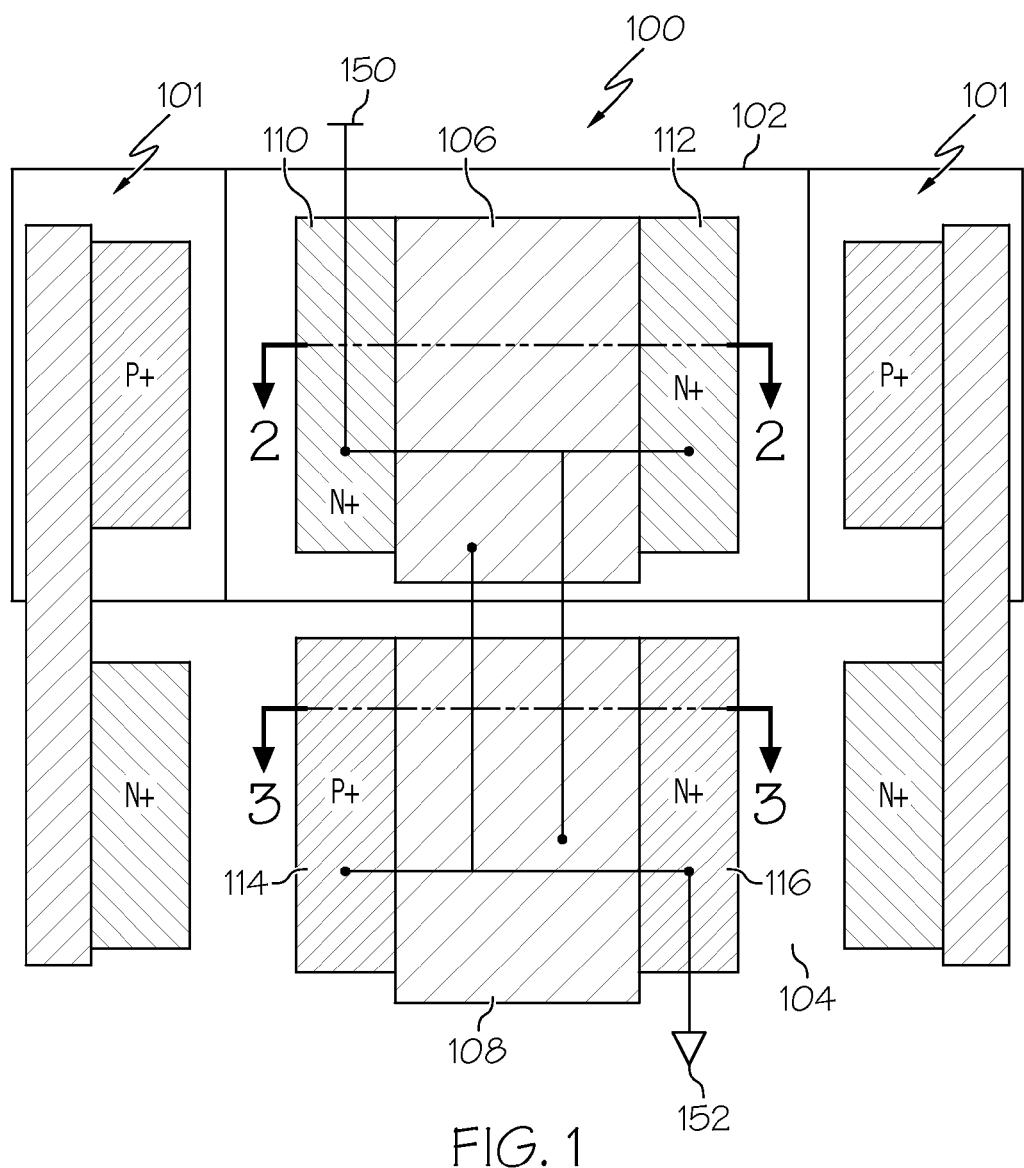
FIG. 1 is a conceptual layout view of a decoupling capacitor (decap) design in accordance with one embodiment.
Figure 2:
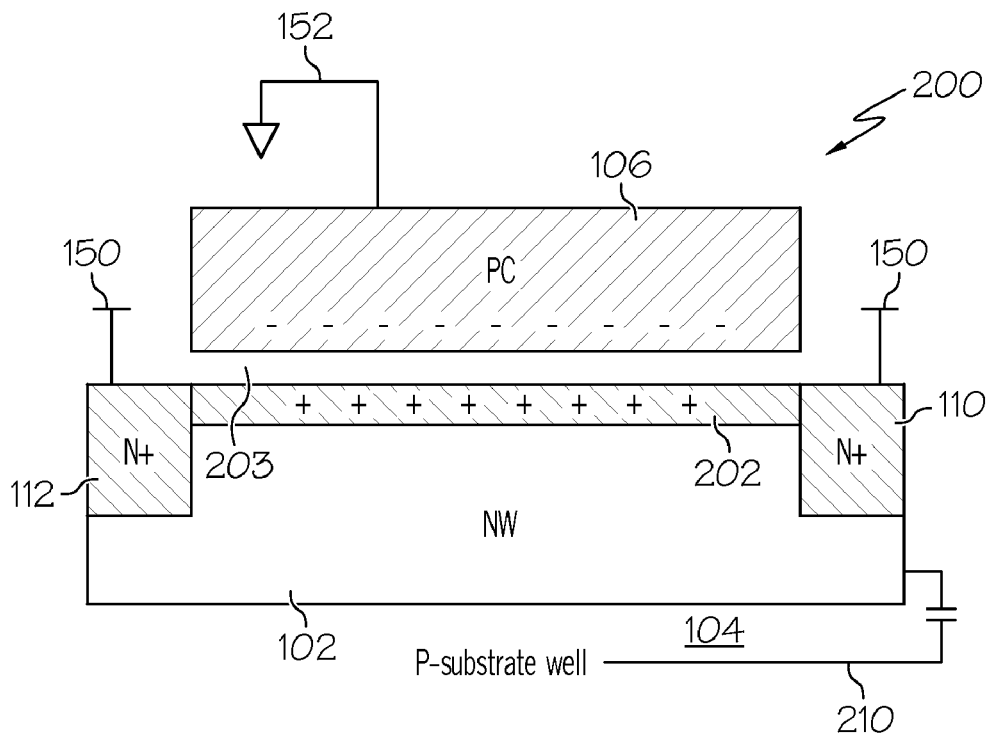
FIG. 2 is a conceptual cross-sectional view of region A-A' of FIG. 1.
Figure 3:
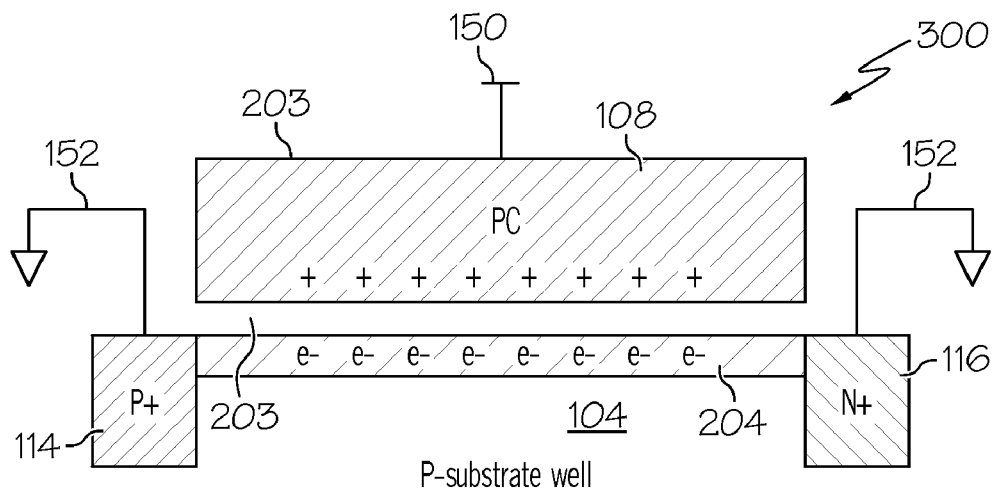
FIG. 3 is a conceptual cross-sectional view of region B-B' of FIG. 1.

Referring now to the layout view shown in FIG. 1 in conjunction with the cross-sectional views depicted in FIGS. 2 and 3, an exemplary decoupling capacitor (or "decap") 100 in the context of a CMOS structure is generally formed in the vicinity of one or more nearby logic regions 101, which may include any number of conventional semiconductor logic components.

Decap 100, which functions to decouple regions 101 from each other, includes two conductors (typically, polysilicon conductors) 106 and 108 positioned over corresponding wells 102 and 104. In the illustrated embodiment, well 104 is a P– substrate well (i.e., a well formed from a portion of the P-substrate), and well 102 is an N-well (i.e., an N-type well formed within the P– substrate). Note that, while the P– region shown in the illustrated embodiment corresponds to a substrate (e.g., a silicon, GaAs, or other suitable semiconductor substrate), this structure also functions as a "well" for the purpose of forming diffused regions (e.g., well-ties), and thus it is common in the art to refer to this structure as a "substrate/well" or a "substrate well."

As shown, conductor 106 is bordered on two sides (or at any other suitable locations along its periphery) by two N+ diffusion regions 110 and 112 formed within N-well 102. Similarly, conductor 108 is bordered by a P+ diffusion region 114 and an N+ diffusion region 116. In this embodiment, diffusion regions 110, 112, 114, and 116 are rectangular and have substantially the same area, shape, and orientation. As depicted schematically, N+ diffusion region 110, N+ diffusion region 112, and conductor 108 are tied to a supply voltage node (or "VDD") 150, while P+ diffusion region 114, N+ diffusion region 116, and conductor 106 are tied to ground node (or "ground") 152. MOS capacitor 300 (illustrated in FIG. 3) is therefore biased in accumulation, whereas MOS capacitor 200 (illustrated in FIG. 2) is biased in depletion. For the purposes of clarity, the various conductive traces, electrodes, and/or other contacts used to provide electrical connectivity between these structures are not shown in the figures.

As shown in FIGS. 2 and 3, an implant region 202 (in this case, a high-dose, low energy implant) is formed within N-well 102 between N+ diffusion regions 110 and 112, adjacent to conductor 106. Similarly, implant region 204 is formed between P+ and N+ diffusion regions 114 and 116 within P– substrate well 104 and adjacent to conductor 108. Implant regions 202 and 204 may be formed from the same high-dose implant, or from different high-dose implants, and may be N-type or P-type species implants, depending upon the desired behavior. In one embodiment, an N-Type implant having a surface concentration of approximately $3E19/cm^3$ is employed. Generally, the implant conditions may be selected such that an active surface dopant concentration of at least $1E19/cm^3$ is achieved. A high active surface dopant concentration reduces the size of the depletion region when the MOS capacitor is biased in depletion, thereby increasing the high frequency capacitance. The high-dose implant also reduces series resistance, further improving the high frequency decoupling of the decap.

Thus, diffusion regions 110, 112, 114, and 116 act as well-ties, i.e., coupling their respective wells to either VDD 150 or ground 152, while the asymmetrical P+ diffusion region 114 effectively protects against latch-up of the decap and nearby logic 101. Furthermore, as depicted schematically, a well capacitance 210 is formed between N-well 102 and P-substrate well 104. This capacitance 210 contributes to decoupling of the circuit.

In general, then, decap 100 can be characterized as two MOS capacitors formed in wells having opposite polarity and having at least one pair of asymmetrical well-ties (or being asymmetrical in some other respect.) That is, one MOS capacitor 200 is formed by conductor 106, an oxide 203, and N-well 102, while another MOS capacitor 300 is formed by conductor 108, oxide 203 (or an oxide layer different from oxide 203), and P– substrate well 104. Well-tie regions 110, 112, 114, and 116 are asymmetrical in that MOS capacitor 300 includes diffusions (114 and 116) of opposite polarity, while MOS capacitor 200 includes diffusions (110 and 112) of the same polarity.

Figure 4:
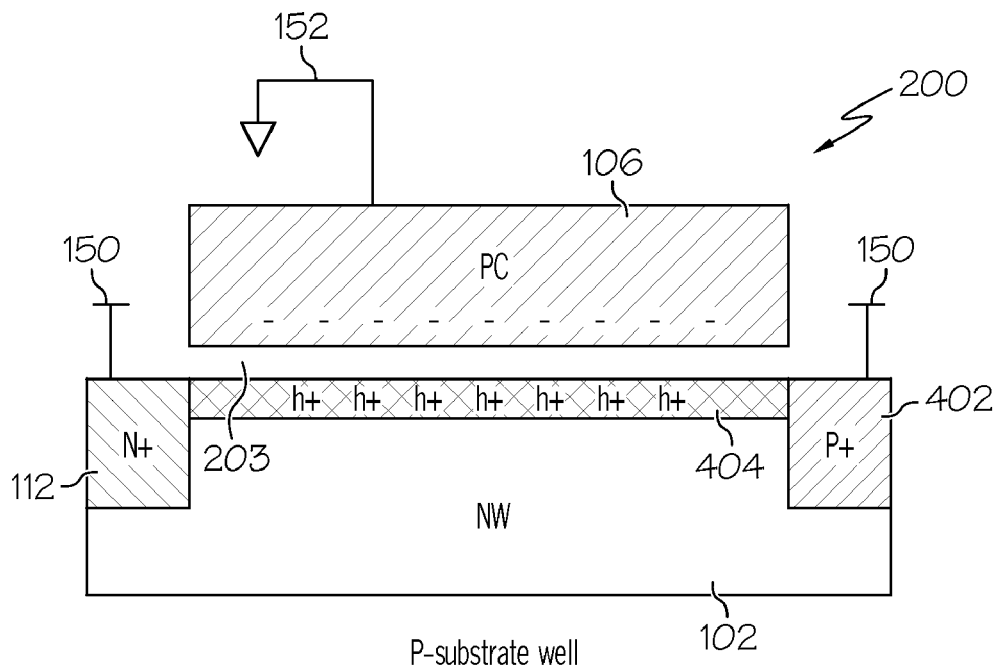
FIG. 4 is a conceptual cross-sectional view of Region A-A' of FIG. 1 in accordance with an alternate embodiment.
Figure 5:
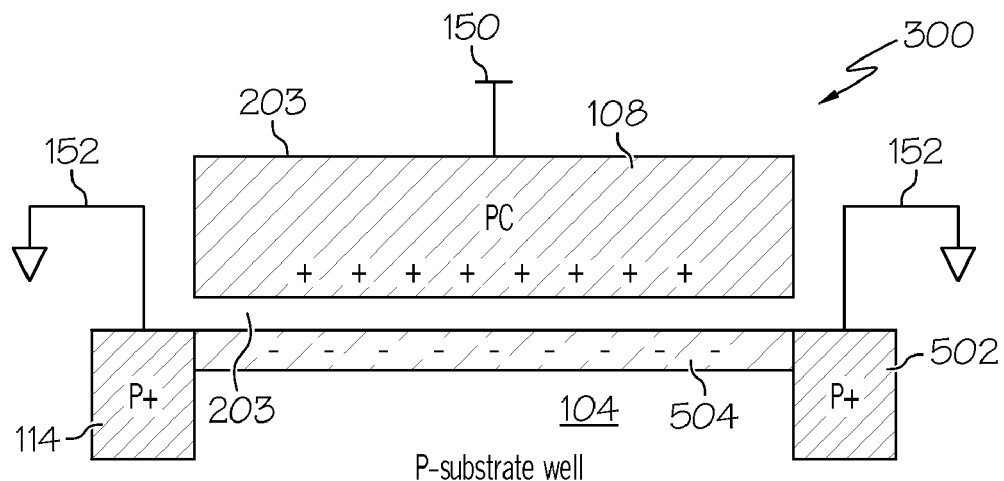
FIG. 5 is a conceptual cross-sectional view of Region B-B' of FIG. 1 in accordance with an alternate embodiment.

FIGS. 4 and 5 depict an alternate embodiment of MOS capacitors 200 and 300, respectively, wherein the implant within N-well 102 is a P+ implant 404, and the asymmetry of well-ties is provided by a P+ implant 402 within N-well 102. In this embodiment, MOS capacitor 300 includes two P+ well-ties 114 and 502. MOS capacitor 200 is therefore biased in accumulation in this embodiment, whereas MOS capacitor 300 is biased in depletion.

Figure 6:
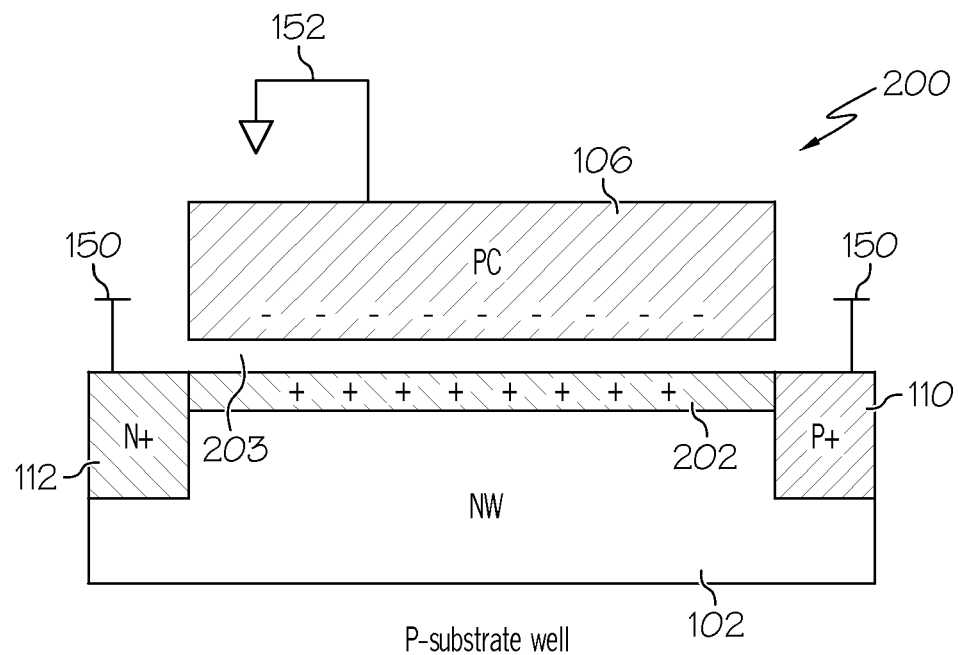
FIG. 6 is a conceptual cross-sectional view of Region A-A' of FIG. 1 in accordance with an alternate embodiment.
Figure 7:
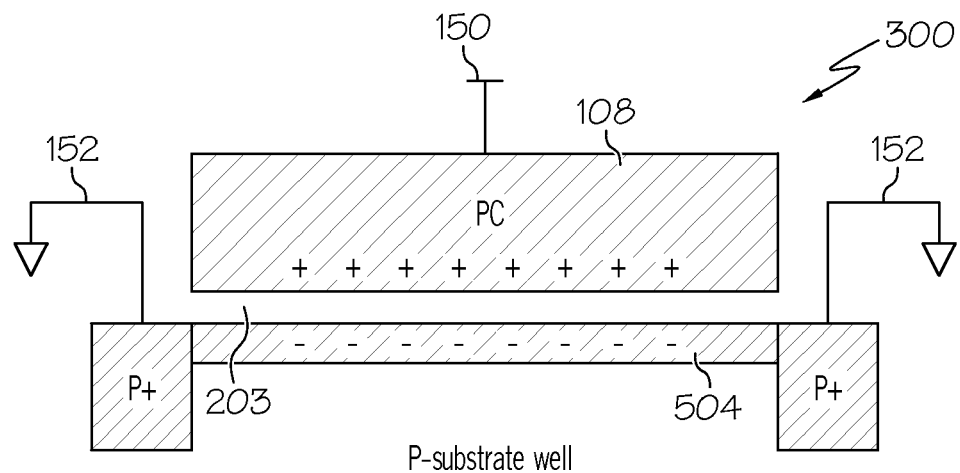
FIG. 7 is a conceptual cross-sectional view of Region B-B' of FIG. 1 in accordance with an alternate embodiment.

In yet another embodiment, shown in FIGS. 6 and 7, separate implants 202 and 504 are used for each MOS-capacitor; that is, implant 202 may be a depleted, N-type implant, while implant 504 is a P-type implant. In such an embodiment, both MOS capacitors 200 and 300 are biased in depletion mode.

Regardless of which embodiment is employed, the illustrated designs are advantageous in that all or substantially all of standard cell transistors within nearby logic regions 101 experience the same one-dimensional well-proximity effect. Furthermore, because decap 100 can be placed relatively close to regions 101, the density of the overall design and the effectiveness of the decoupling are improved vis-à-vis traditional decap methods.

Figure 8:
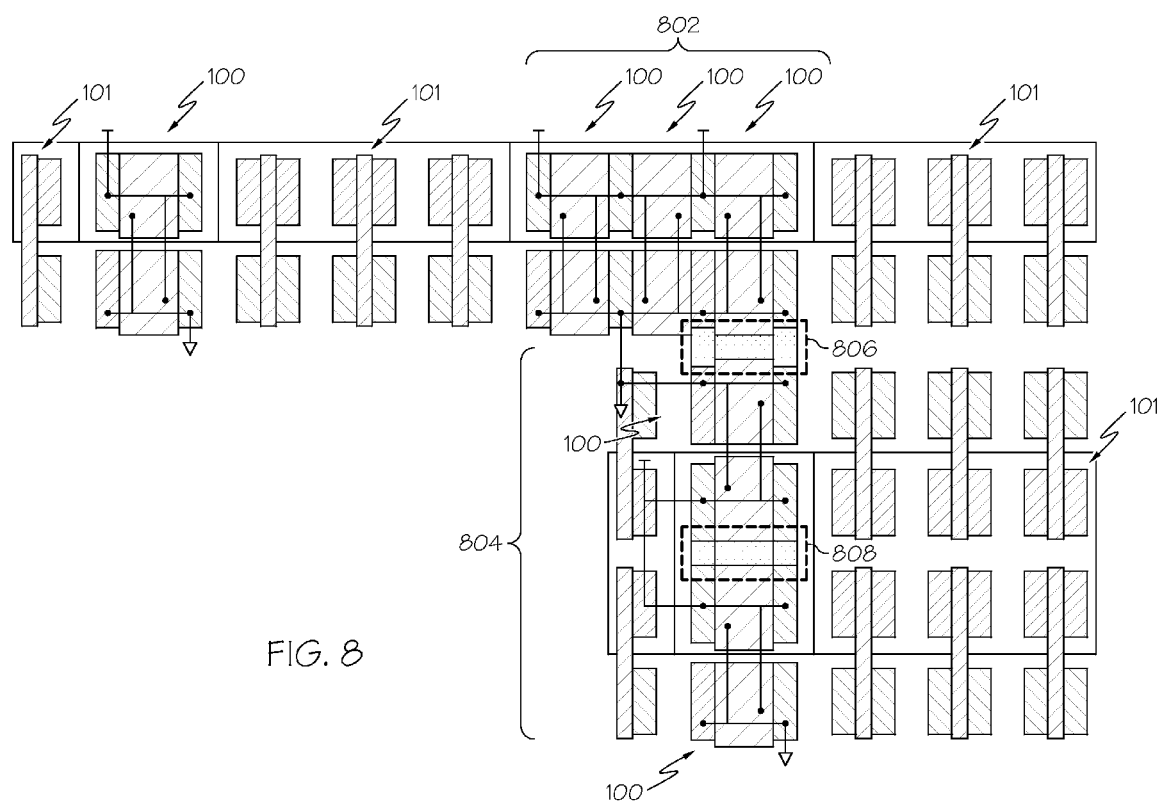
FIG. 8 is a conceptual layout view showing multiple adjacent decoupling capacitors used in various embodiments.

Moreover, a particular decap 100 may be configured as a mirrored instance of itself reflected along either the x or y axes. This can be seen in FIG. 8, which shows the placement of exemplary decaps 100 within standard cell rows at arbitrary locations and with standard cell heights. Region 802, for example, depicts a set of three adjacent decaps 100 placed with their longitudinal axes oriented parallel to each other (and the y-axis). Conversely, region 804 shows two adjacent decaps 100 oriented with co-linear longitudinal axes (also parallel to the y-axis).

It will be apparent that the edges of wells 102 and 104 are continuous and substantially straight over distances extending beyond multiple transistors, e.g. hundreds of nanometers or microns or larger, such that layout-dependent WPE is minimized. Because decaps 100 electrically couple wells 102 and 104 to VDD and the ground node, respectively, for the surrounding logic circuitry 101, dedicated well contacts for logic circuitry 101 are not necessary. Well capacitance 210 will therefore include contributions from wells 102 and 104 in the regions of logic circuitry 101, which may amount to significant low-frequency capacitances, e.g. 0.1-100 fF, depending on the size of wells 102 and 104. Filler cells 806 and 808 may be provided for abutting columns to extend and merge the adjacent MOS capacitors of the same polarity of decaps 100, so as to increase decoupling capacitance density per area.

The various embodiments shown above can be manufactured in a variety of ways, including standard CMOS processing steps and photolithography well known in the art. In one embodiment, the high-dose, low-energy implants 202 and 204 can be made before gate processing. These dopants can then be activated during source and drain anneal, or in a separate anneal step.

Figure 9:
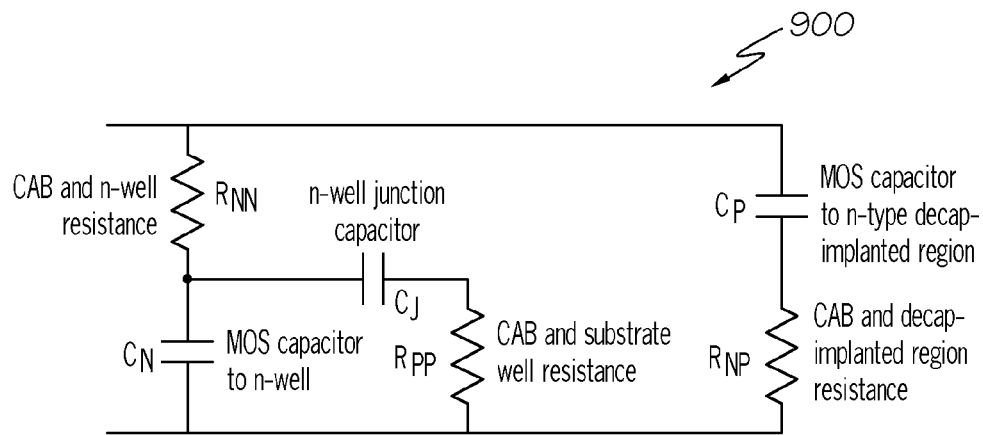
FIG. 9 is a schematic diagram showing an equivalent circuit for the embodiment depicted in FIG. 1.

FIG. 9 presents an equivalent circuit 900 for the embodiment depicted in FIGS. 1-3. As shown, circuit 900 includes a capacitance $C_N$ corresponding to MOS capacitor 200, a capacitance $C_J$ corresponding to the junction capacitance between N-well 102 and P− substrate well 104 (i.e., capacitor 210), and a capacitance $C_P$ corresponding to MOS capacitor 300. Circuit 900 also includes a resistance $R_{NN}$ corresponding to the resistance of N-well 102 and a number of metal contacts to silicon (CAB), a resistance $R_{NP}$ corresponding to the CAB resistance and the resistance of implanted region 204, and a resistance $R_{PP}$ corresponding to the CAB and P− substrate well 104 resistance.

Figure 10:
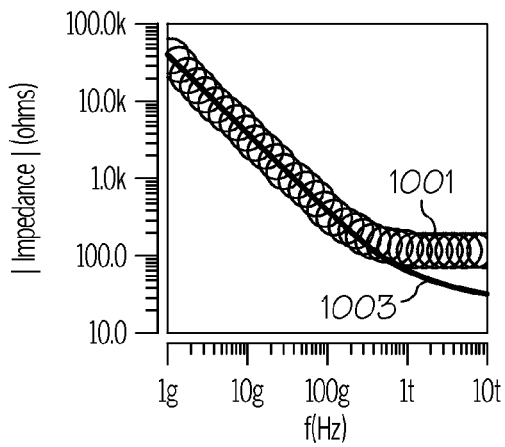
FIG. 10 is a graph showing the relationship between impedance and frequency for an exemplary decap embodiment.
Figure 11:
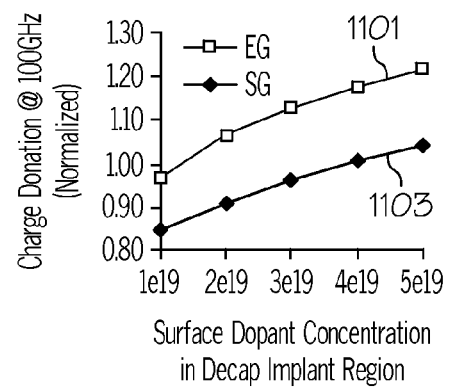
FIG. 11 is a graph showing the relationship between charge donation and dopant concentration in an exemplary embodiment.

The behavior of equivalent circuit 900 is shown in FIGS. 10 and 11 for particular estimated parameters—i.e., $R_{NN}$=44.5Ω, $R_{PP}$=1879.4Ω, $R_{NP}$=98.8Ω, $C_N$=0.8 fF, $C_P$=2.8 fF, and $C_J$=0.22 fF, with an assumed surface concentration of 3E19/cm$^3$. FIG. 10 depicts the impedance of the circuit (curve 1003) vs. the impedance of a conventional decap circuit (curve 1001) as function of frequency. The conventional decap is a single MOS capacitor in an n-well biased in accumulation formed with a conventional process. Although the conventional decap has the same layout area footprint as the embodiment pictured in FIGS. 1-3, it requires greater spacing to logic circuitry 101 and introduces WPE variation to the neighboring transistors. As can be seen, across a large range of frequencies, the impedance is comparable to that of the conventional decap. Beyond approximately 400 GHz, the impedance is significantly reduced compared to the conventional process. FIG. 11 depicts the change in charge donation (at 100 GHz), normalized to that of the conventional decap, vs. surface dopant concentration in the decap implant regions (i.e., regions 202 and 204). Curve 1102 depicts the model parameters listed above, while curve 1103 depicts a model with thicker oxide and the parameters $C_N$=0.59 and $C_P$=1.27 fF.

The various structures and methods described above may be accomplished, for example, in conjunction with a computer readable medium (e.g., ROM, RAM, or other storage device) that stores data and instructions such as Verilog, HDL, GDS data, or the like, as is known in the art. These instructions may then be used (e.g., through a mask synthesis process) to create appropriate masks or otherwise configure manufacturing facilities to generate devices embodying various of the methods and structures described above.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A decoupling capacitor structure comprising:
 a first well having a first dopant polarity and a first high-dose implant formed therein;
 a second well adjacent the first well and having a second dopant polarity opposite the first dopant polarity, the second well having a second high-dose implant formed therein;
 at least one insulating layer formed over the first high-dose implant and the second high-dose implant;
 a first set of well-ties formed in the first well;
 a second set of well ties formed in the second well;
 a first conductor formed over the first well adjacent the first high-dose implant; and
 a second conductor formed over the second well adjacent the second high-dose implant;
 wherein the first set of well-ties and the second conductor are commonly tied to a first electrical node, and the second set of well-ties and the first conductor are commonly tied to a second electrical node; and
 wherein at least one of the first set of well-ties, the second set of well-ties, and the high-dose implants are asymmetrical with respect to dopant polarity.

2. The decoupling capacitor structure of claim 1, wherein the first electrical node corresponds to a supply voltage node and the second electrical node corresponds to a ground node.

3. The decoupling capacitor of claim 1, wherein the second well comprises a P-material, and the first well comprises an N-type region formed within the P-substrate material.

4. The decoupling capacitor of claim 3, wherein the second set of well-ties includes a first well-tie having a P+ dopant polarity and a second well-tie having a N+ dopant polarity.

5. The decoupling capacitor of claim 1, wherein the first well and the second well correspond to the respective first and second wells of a set of logic transistors.

6. A method of forming a decoupling capacitor comprising:
 providing a substrate having a first dopant polarity and defining a first well region;
 forming a second well region adjacent the first well region within the substrate, the second well region having a second dopant polarity opposite the first dopant polarity;
 forming a first high-dose implant within the first well region;
 forming a second high-dose implant within the second well region;
 forming a first set of well-ties in the first well;
 forming a second set of well-ties in the second well;
 forming at least one insulating layer over the first high-dose implant and the second high-dose implant;
 forming a first conductor over the first well region and a second conductor over the second well region;
 interconnecting the first set of well-ties and the second conductor to define a first electrical node; and
 interconnecting the second set of well-ties and the first conductor to define a second electrical node;
 wherein at least one of the first high-dose implant, the second high-dose implant, the first set of well-ties, and the second set of well-ties are formed such that they are asymmetrical with respect to dopant polarity.

7. The method of claim 6, wherein the first electrical node corresponds to a supply voltage node and the second electrical node corresponds to a ground node.

8. The method of claim 6, wherein the second well comprises a P− material, and the first well comprises an N-type region formed within the P-substrate material.

9. The method of claim 8, wherein the second set of well-ties includes a first well-tie having a P+ dopant polarity and a second well-tie having a N+ dopant polarity.

10. The method of claim 8, including the first well and the second well are formed such that they are shared by at least one set of logic transistors.

11. A semiconductor device comprising:
a plurality of logic devices disposed in a regular pattern within a first well and a second well, wherein the first well has a first dopant polarity and the second well has a second dopant polarity opposite the first dopant polarity;
a decoupling capacitor disposed within the first well and the second well consistent with the regular pattern, the decoupling capacitor comprising a first set of well-ties in the first well, a second set of well-ties in the second well, a first conductor formed over a first high-dose implant in the first well, and a second conductor formed over a second high-dose implant in the second well;
wherein the first set of well-ties and the second conductor are commonly tied to a first electrical node, and the second set of well-ties and the first conductor are commonly tied to a second electrical node; and
wherein at least one of the first set of well-ties, the second set of well-ties, and the high-dose implants are asymmetrical with respect to dopant polarity.

12. The semiconductor of claim 11, wherein the first electrical node corresponds to a supply voltage node and the second electrical node corresponds to a ground node.

13. The semiconductor of claim 11, wherein the second well comprises a P-material, and the first well comprises an N-type region formed within the P-substrate material.

14. The semiconductor of claim 13, wherein the second set of well-ties includes a first well-tie having a P+ dopant polarity and a second well-tie having a N+ dopant polarity.

15. A computer readable medium having computer-readable instructions embodied therein, wherein the computer-readable instructions are adapted to be executed to configure a manufacturing facility to form a decoupling capacitor comprising:
a first MOS capacitor in a first well;
a second MOS capacitor in a second well, the second MOS capacitor having a polarity that is opposite that of the first MOS capacitor; and
at least one pair of asymmetrical well ties coupled to the first and second MOS capacitors.

16. The computer readable medium of claim 15, wherein the at least one pair of asymmetrical well-ties comprises the first MOS capacitor having diffusion regions of opposite polarity and the second MOS capacitor having diffusion regions of the same polarity.

17. The computer readable medium of claim 15, wherein the first and second wells are each shared by at least one set of logic transistors.

* * * * *